(12) United States Patent
Scott

(10) Patent No.: US 6,971,243 B2
(45) Date of Patent: Dec. 6, 2005

(54) HEAT SINK

(75) Inventor: Alexander Robin Walter Scott, Calgary (CA)

(73) Assignee: Coolit Systems Inc., Calgary (CA)

( * ) Notice: Subject to any disclaimer, the term of this patent is extended or adjusted under 35 U.S.C. 154(b) by 0 days.

(21) Appl. No.: 10/710,792

(22) Filed: Aug. 3, 2004

(65) Prior Publication Data

US 2005/0045313 A1    Mar. 3, 2005

Related U.S. Application Data

(60) Provisional application No. 60/481,213, filed on Aug. 12, 2003.

(51) Int. Cl.[7] ............................................... F25B 21/02
(52) U.S. Cl. ........................................ 62/3.7; 62/259.2
(58) Field of Search ............................ 62/3.2, 3.3, 3.7, 62/259.2

(56) References Cited

U.S. PATENT DOCUMENTS

| | | |
|---|---|---|
| 5,020,586 A | 6/1991 | Mansingh |
| 5,072,787 A | 12/1991 | Nakamichi et al. |
| 5,381,859 A | 1/1995 | Minakami et al. |
| 5,457,342 A | 10/1995 | Herbst, II |
| 5,509,465 A | 4/1996 | Lai |
| 5,947,192 A | 9/1999 | Kuo |
| 5,964,285 A | 10/1999 | Huang |
| 5,988,266 A | 11/1999 | Smith et al. |
| 6,062,301 A | 5/2000 | Lu |
| D426,196 S | 6/2000 | Lee |
| D426,814 S | 6/2000 | Lee |
| 6,138,352 A | 10/2000 | Smith et al. |
| 6,199,627 B1 | 3/2001 | Wang |
| 6,223,815 B1 | 5/2001 | Shibasaki |
| 6,269,003 B1 | 7/2001 | Wen-Chen |
| 6,310,771 B1 | 10/2001 | Chien |
| 6,330,906 B1 | 12/2001 | Wang |
| 6,341,490 B1 | 1/2002 | Jones |
| D458,232 S | 6/2002 | Lee |
| 6,404,632 B1 | 6/2002 | Forkas |
| 6,424,533 B1 | 7/2002 | Chu et al. |
| 6,446,442 B1 * | 9/2002 | Batchelor et al. .............. 62/3.3 |
| 6,604,575 B1 | 8/2003 | Degtiarenko |
| 6,619,044 B2 * | 9/2003 | Batchelor et al. .............. 62/3.3 |
| 2002/0043360 A1 | 4/2002 | Lee |
| 2002/0121358 A1 | 9/2002 | Lee |

FOREIGN PATENT DOCUMENTS

| | | |
|---|---|---|
| DE | 198 41 583 | 3/2000 |
| GB | 2 059 569 | 4/1981 |
| JP | 57 188855 | 2/1983 |
| JP | 2003 069266 | 7/2003 |
| WO | WO 03/007372 | 1/2003 |

* cited by examiner

*Primary Examiner*—Melvin Jones
(74) *Attorney, Agent, or Firm*—Bennett Jones LLP

(57) ABSTRACT

A heat sink is described for extracting heat from at least one electronic device, such as a microprocessor, either directly or indirectly (i.e. via liquid coolant). The heat sink includes a first thermal plate, a second thermal plate and a plurality of fins integral with and extending between both the first thermal plate and the second thermal plate.

18 Claims, 4 Drawing Sheets

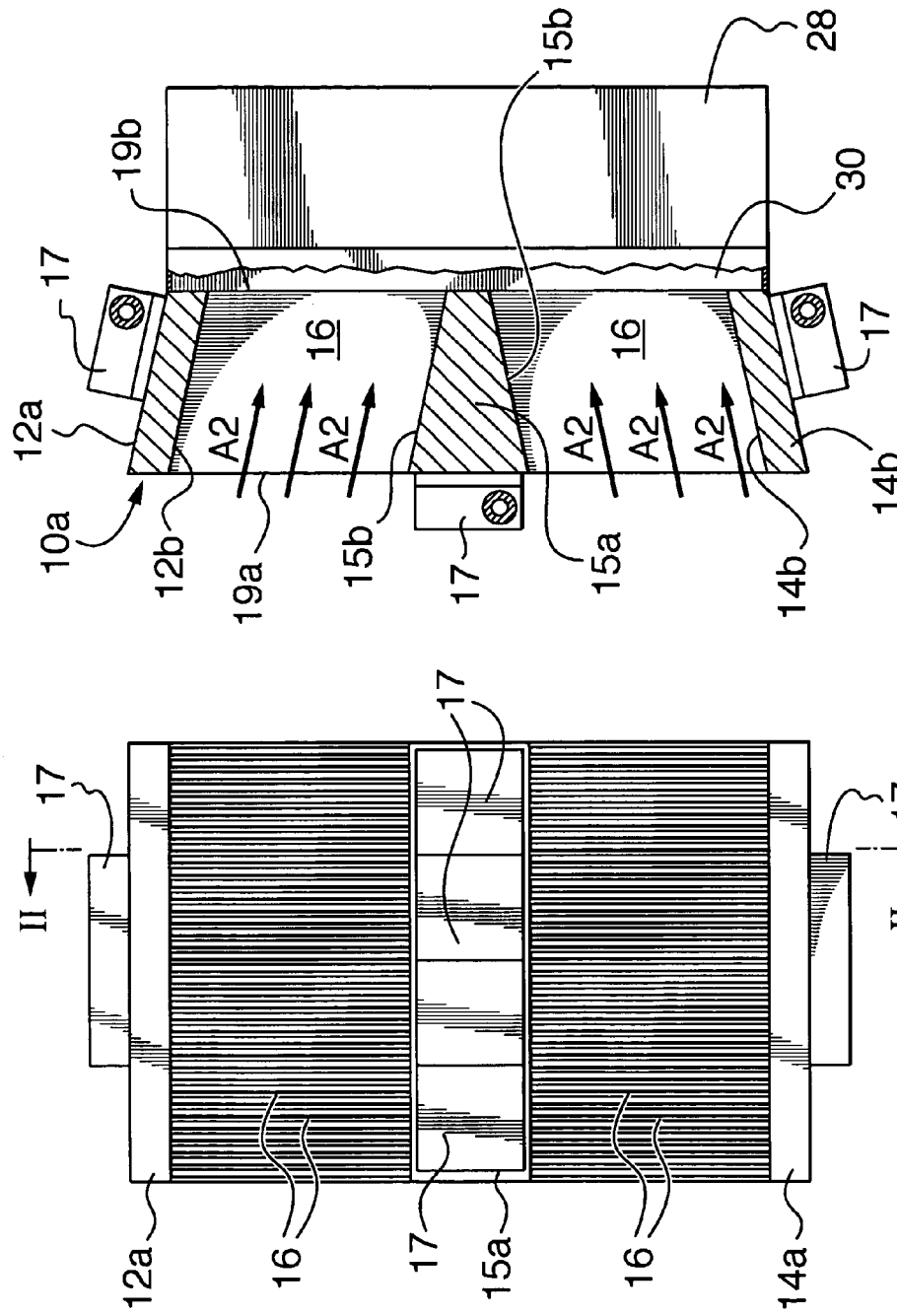

HEAT SINK

CROSS REFERENCE TO RELATED APPLICATIONS

This application claims priority to U.S. provisional patent application No. 60/481,213, filed Aug. 12, 2003.

BACKGROUND OF INVENTION

The invention relates to the field of cooling electronic devices and, in particular, to heat sinks.

Heat sinks, also termed radiators or chillers, are used to conduct heat away from the electrical components and into a passing fluid such as air. A heat sink generally may include a thermal plate and a number of fins protruding from the thermal plate. The thermal plate is installed in contact with a heat source such as directly on an electrical component or in contact with a heat exchange liquid, often called a coolant. Where liquid coolant is used, for example, the liquid is pumped through a block on the heat source where it becomes heated and then the heated liquid is pumped to a heat sink located at some distance from the block. Once the heated liquid arrives at the heat sink, heat is conducted into the thermal plate and out into the fins wherein the heat is passed into a fluid such as an airflow passing through the fins. The airflow may be ambient or driven by a fan.

General information concerning heat sinks, is contained in applicant's corresponding published application WO 03/007372, dated Jan. 23, 2003 and is incorporated herein by reference.

SUMMARY OF INVENTION

In one aspect the invention provides a heat sink. The heat sink includes a first thermal plate, a second thermal plate and a plurality of fins integral with and extending between both the first thermal plate and the second thermal plate.

The first thermal plate and the second thermal plate are configured to receive heat from one or more electronic devices for example by thermal coupling directly or indirectly therewith. The heat sink can extract heat from an electronic device, such as a microprocessor, either directly or indirectly for example, via a liquid coolant.

The thermal plates can be positioned at external sides of the heat sink. In one embodiment, the thermal plates are positioned at opposite ends of the heat sink with the fins extending therebetween so that heat-conducting components can be applied directly to the thermal plates without blocking airflow through the central finned areas. An outer insulative coating can be applied to the outer surfaces of the heat sink to prevent heat from radiating outwardly from the heat sink except through the fins.

BRIEF DESCRIPTION OF DRAWINGS

To facilitate understanding reference may be made to the following drawings of various embodiments.

FIG. 6 is a front elevation of a heat sink of FIG. 5 with another arrangement of heat source devices mounted thereon.

FIG. 7 is a sectional view along line II—II of FIG. 6 in an assembly with other components.

DETAILED DESCRIPTION

Figure 1:
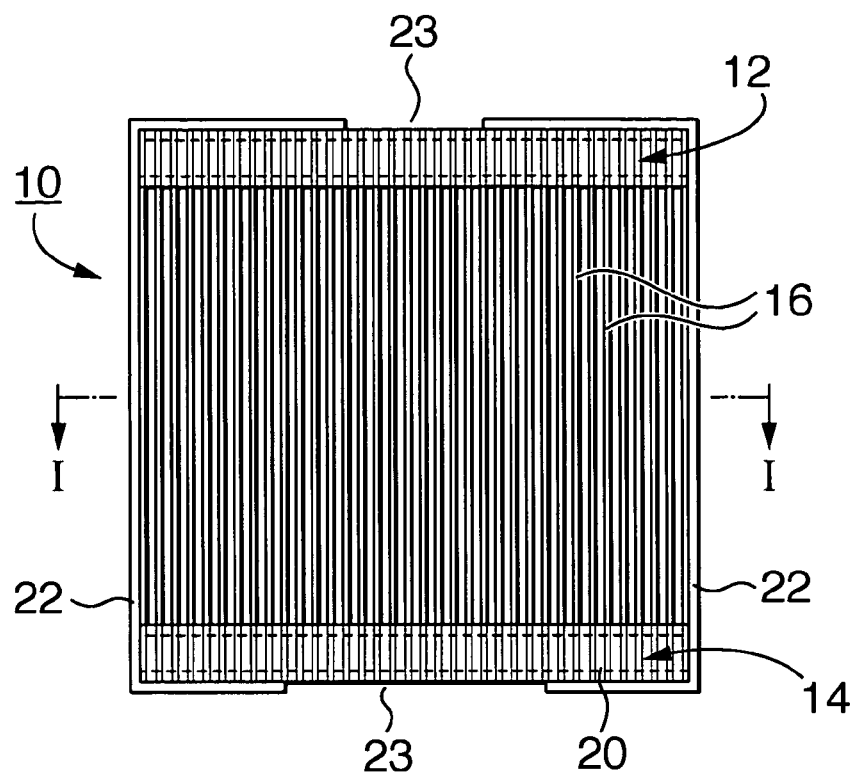
FIG. 1 is a front elevation of a heat sink according to the present invention.
Figure 2:
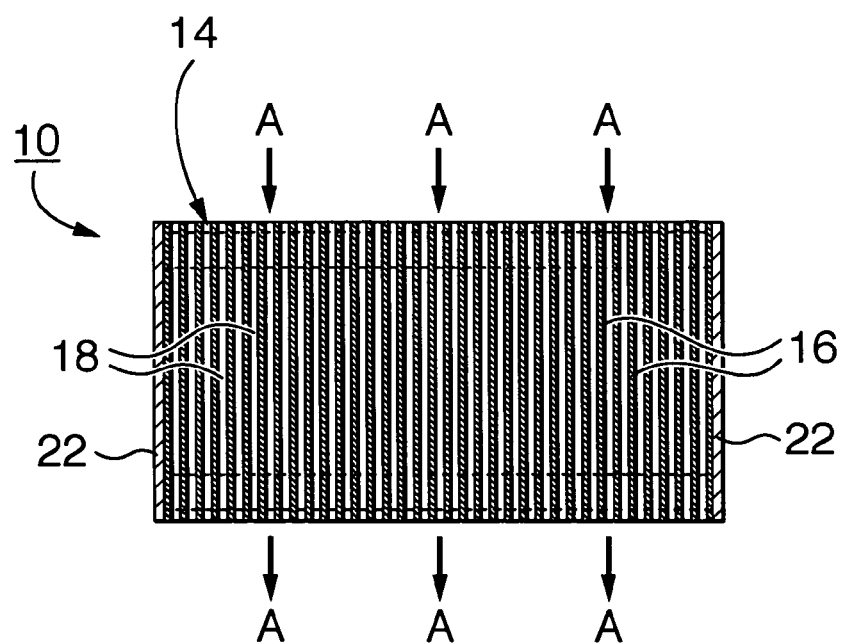
FIG. 2 is a section through I—I of FIG. 1.

Referring to FIGS. 1 and 2, a heat sink 10 is shown including a first thermal plate 12, a second thermal plate 14 and a plurality of fins 16 extending between plates 12, 14 and in heat conducting communication therewith. The fins and thermal plates are formed of heat conducting material such that heat energy applied to the surfaces of the thermal plates can spread through the thermal plates and be conducted through the fins. Heat energy may then be dissipated from the fins into air passing between the fins. The fins are spaced apart such that air can pass through the spaces 18 therebetween, for example along arrows A. Of course, the dimensions of the heat sink and its components may vary significantly depending on size requirements, materials, fluid viscosity of the air flow, etc. However, as an example of one possible embodiment, the fins may be 0.5 to 1.5 mm wide and spaced a distance of 1.0 to 2.5 mm.

The heat sink can be formed in any desired way that meets the requirements of heat conduction and includes forming the fins as part of the thermal plates. This provides that the fins become integral with the thermal plates and extend continuously therebetween. A first end of each fin forms a part of first thermal plate 12 and a second end of each fin forms a part of the second thermal plate. In one embodiment, an end of each fin forms a portion of the external surface of each thermal plate. For example in one method, the fins may be formed as plates and may be mounted in alternating fashion with end spacers 20. The plates and spacers may then be held together and secured in place, as by brazing. To facilitate assembly in such a method, the fin plates and spacers can each include spaced apertures (item 21 in FIG. 4) through which the plates and spacers can be alternately positioned over an assembly spike before brazing. The fin plates and spacers are each formed of heat conducting material such as anodized aluminum, aluminum, copper, alloys, etc.

The arrangement of continuous fins between the thermal plates permits a single heat sink to be operated with heat input from two ends of the fins. This permits the fins to more efficiently handle heat input, as the entire length of each fin may be used for heat dissipation and no connections or breaks occur along the fins that may jeopardize even thermal dissipation and operation. This permits a better use of fin surface area and a more stable temperature over the entire surface of a fin enhancing material and, thereby, heat sink performance.

Fins 16 may be formed substantially planar and positioned in parallel to enhance laminar flow therethrough. The planes of the fins may extend substantially perpendicularly to the thermal plates.

The heat sink can include a housing, but as in the illustrated embodiment, a housing like containment may be achieved from the outermost, side fins and the thermal plates. The heat sink can include a coating 22 of thermal insulation over at least some of its outer surfaces. Spaces 23 may be left open on the outer surface of thermal plates 12, 14 so that they can accept a thermal coupling to a heat source. The thermal insulation, such as a non-heat conductive aluminum, chrome or polymer, prevents heat release apart from the fins of the heat sink, which heat may be radiated back into the computer housing.

Figure 3:
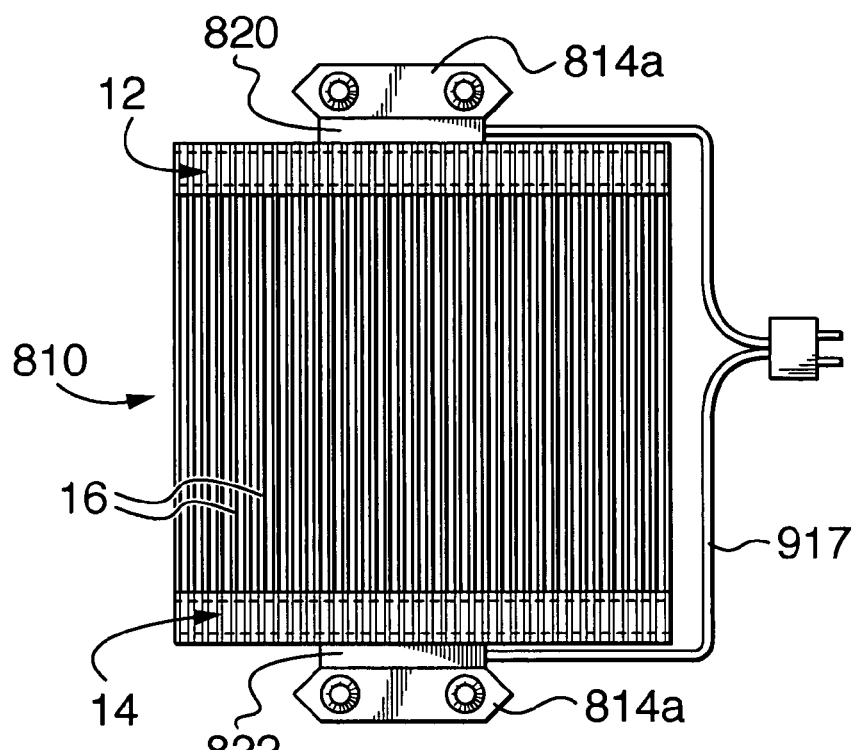
FIG. 3 is a front elevation of an assembled heat sink including heat exchanger blocks installed thereon.
Figure 4:
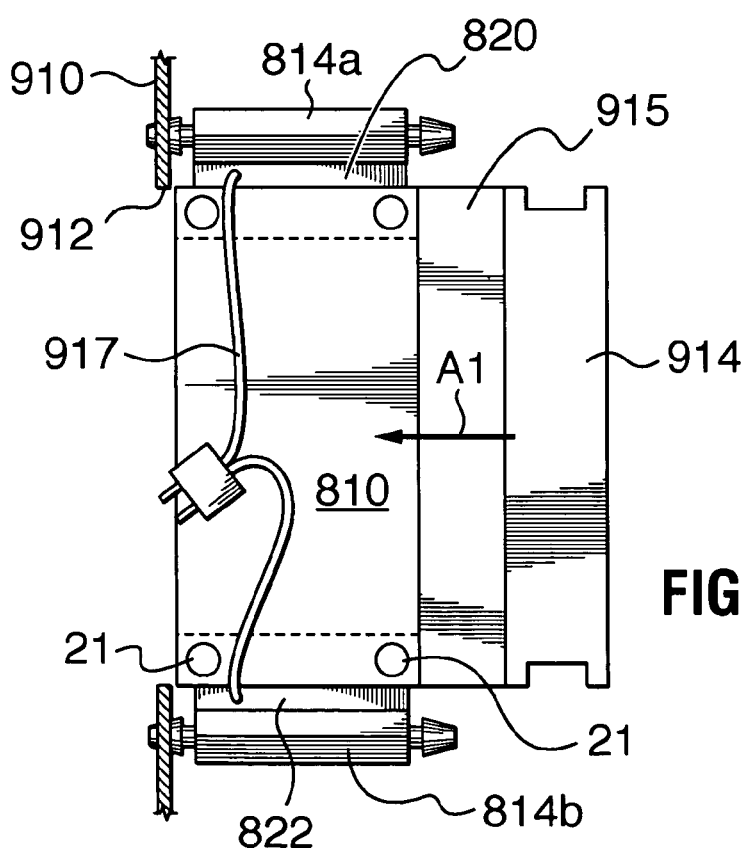
FIG. 4 is a side elevation of the assembly of FIG. 3 installed in a housing.

FIGS. 3 and 4 illustrate a chiller 810 for an electronic device such as a personal computer (PC). The chiller is assembled and includes a heat sink 10 and chiller heat exchangers 814a, 814b. Some possible forms of heat exchangers are described in WO03/007372. The chiller may operate to pass heat from the heat sink to air passing thereby. As such, the chiller can operate in cooperation with a fan 914 or can be oriented to operate in a chimney fashion, without the use of a fan, wherein air moves through the heat sink by convection. Chiller 810 includes a fan in the illustrated embodiment.

Chiller 810 includes a heat sink with a pair of thermal plates 12, 14 and a plurality of fins 16 extending between, thermally coupled and formed integral to each of the thermal plates. Chiller 810 may be mountable in alignment with an opening 912 in a wall 910 of the case of a PC. When assembled for use, the assembly may include, for example, a fan 914, a duct 915, a chiller heat exchanger 814a for the first thermal plate and a chiller heat exchanger 814b for the second thermal plate and two conventional thermoelectric heat pumps 820, 822 (also called thermoelectric coolers or TEC"s), which are connected to a power supply, for example of the PC, via lines 917.

When installed in the case of the PC, heat exchangers 814a, 814b become heat sources for the heat sink. The chiller heat exchangers 814a, 814b may, for example, be blocks through which a heated fluid may be circulated. In the illustrated assembly, each chiller heat exchanger 814a, 814b is positioned on the cold side of its associated thermoelectric heat pump 820 or 822 so that a large proportion of the surface area of the chiller heat exchanger may be thermally coupled to the cold side of its thermoelectric heat pump. The thermoelectric heat pumps 820, 822 are each sandwiched between their chiller heat exchanger and their thermal plate 12, 14, respectively, so that the hot sides of the thermoelectric heat pumps 820, 822 are thermally coupled to the thermal plates.

Duct 915 provides a buffer zone between the fan 914 and the chiller 810. The purpose of the buffer zone is to allow airflow from the circular outlet of the fan 914 to reach the corners of the chiller, which has a square cross-section, and to avoid or reduce interference drag.

Optionally, a plurality of parallel spaced apart fins (not shown) may be joined to a portion of the side of the thermal plates that are thermally coupled to the hot side of the thermoelectric heat pumps. This, however, may require forming a housing about the optional fins to contain and direct airflow therethrough.

In operation, chiller 810 chills fluid that has picked up heat from a component, such as a microprocessor, within the computer and is pumped through the chiller heat exchangers 814a, 814b. The cold sides of the two thermoelectric heat pumps 820, 822 absorb heat from the chiller heat exchangers and pump it to their respective hot sides. The thermal plates 12, 14 in turn receive the heat energy from the thermoelectric pumps and transfer that heat to the fins 16. Air, forced between the fins by the fan 914 picks up heat from the fins and carries that heat out of the case of the PC. The fan can be positioned to drive or pull air through the fins. In the illustrated embodiment, the fan is positioned to drive air through the fins and out the opening, as shown by arrow A1.

Figure 5:
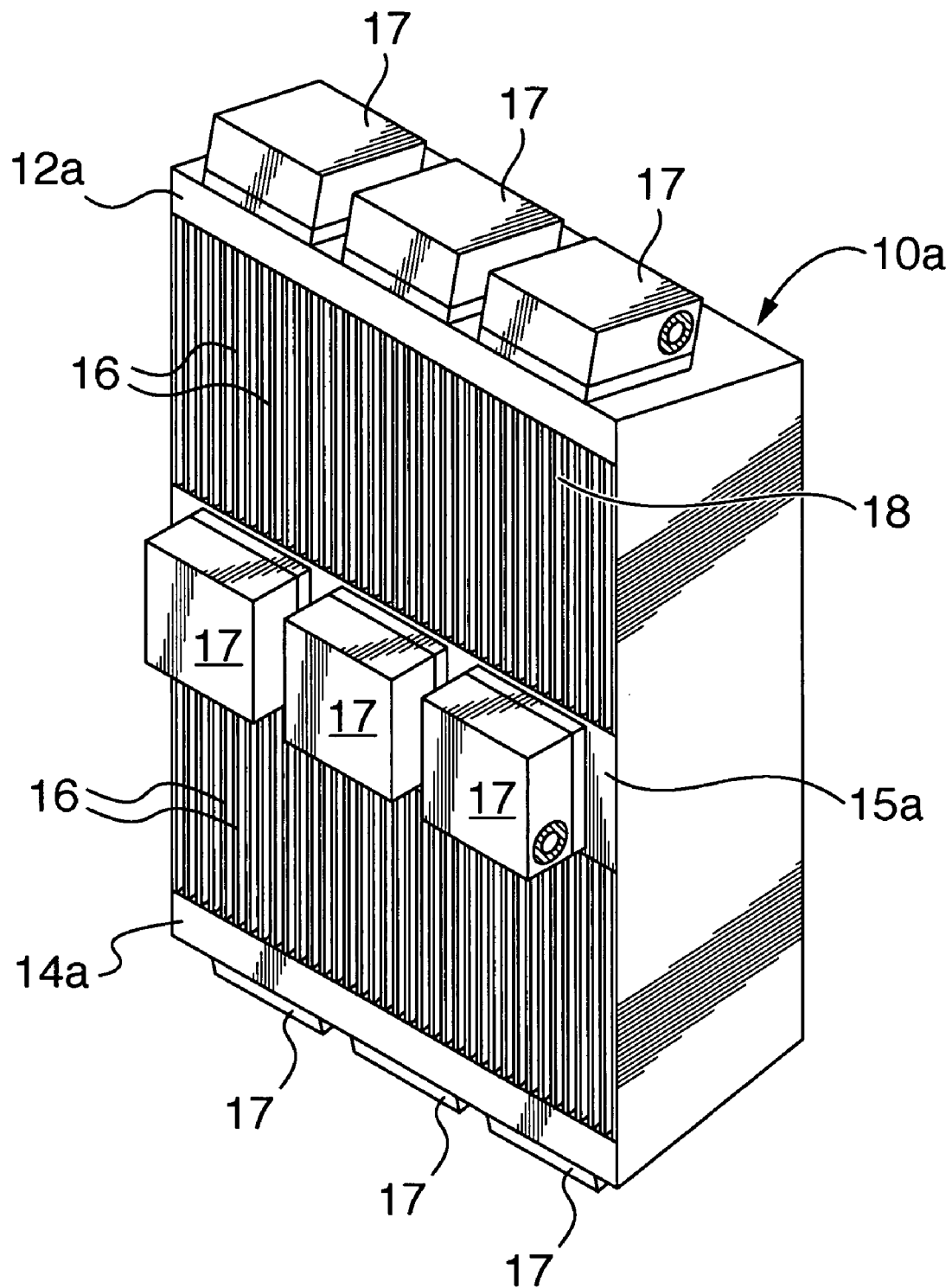
FIG. 5 is a perspective view of another heat sink according to the present invention with heat sources mounted thereon.

Referring to FIGS. 5 to 7 another heat sink 10a is shown. Heat sink 10a includes a first thermal plate 12a, a second thermal plate 14a and a middle thermal plate 15a. A plurality of fins 16 extend between plates 12a, 14a and 15a. The fins and the thermal plates are formed of heat conducting material such that heat energy applied to the surfaces of the thermal plates can spread through the thermal plates and be conducted through the fins. Heat energy may then be dissipated from the fins into air passing between the fins. The fins are spaced apart such that air can pass through the spaces 18 therebetween, for example along arrows A2. At least some of the plurality of fins are formed integral with, and are in heat conducting communication with, each of the plates 12a and 15a and at least some of the plurality of fins are formed integral with, and are in heat conducting communication with, each of the plates 14a and 15a. In one embodiment, at least some and possibly all of the fins 16 are formed integral with all of the thermal plates 12a, 14a and 15a, for example extending from plate 12a through plate 15a to plate 14a.

Each thermal plate includes an external surface onto which one or more heat source devices 17 may be thermally coupled. Heat source devices may include, for example, one or more TEC"s, fluid heat exchangers, etc. Provision of one or more middle thermal plate, such as thermal plate 15a, provides that thermal energy may be applied to the fins along their length, again making efficient use of the fin surface area.

Since the heat sink tends to form its own housing defined by the side fins and the thermal plates, the heat sink can be formed as desired to direct the flow of air. The heat sink air passages 18 may be formed in various ways. In the illustrated embodiment, for example, air passages converge from airflow intake end 19a to output end 19b of the heat sink such that airflow directed though a smaller output opening. It may be desirable, however, to form the air passages to facilitate the establishment of laminar flow therethrough. For example, to urge laminar flow through the air passages, fins 16 may be selected to be substantially planar along their interfacing side surfaces and positioned substantially parallel with each other and the heat plate surfaces 12b, 14b and 15b that are open to air passages 18 also may be formed to be substantially planar and substantially parallel with each other to permit a laminar airflow therebetween.

Although various methods may be used to construct heat sink 10a, it may be useful to provide a plurality of fins that extend from the planned outer surface of thermal plate 12a to the planned outer surface of thermal plate 14a, to hold those plurality of fins in spaced apart condition and to fill in the spaces between the fins to form the thermal plates 12a, 14a, and 15a. This can be done, for example, by molding material about the fins or by the method described hereinabove wherein spacers are positioned between the fins and the assembly is fused, as by brazing to form the outer surfaces of the thermal plates.

The heat sink can be incorporated into an assembly for use that may, for example, include heat source devices 17 thermally coupled at the thermal plates, a fan 28, a duct 30, as shown, and/or other components.

Other embodiments will be apparent to those skilled in the art and, therefore, the invention is defined in the claims.

What is claimed is:

1. A heat sink comprising: a first thermal plate, a second thermal plate, a plurality of adjacent fins integral with and extending between both the first thermal plate and the second thermal plate, the plurality of adjacent fins each having interfacing side surfaces, and a plurality of end spacers mounted between the plurality of adjacent fins to space and form fluid passages between the interfacing side surfaces thereof and the plurality of adjacent fins each extending continuously between the first thermal plate and the second thermal plate to establish laminar fluid flow through the fluid passages.

2. The heat sink of claim 1 wherein first and second thermal plates are positioned at external sides of the heat sink.

3. The heat sink of claim 1 wherein the thermal plates are positioned at opposite ends of the heat sink with the plurality of adjacent fins extending substantially perpendicularly therebetween.

4. The heat sink of claim 1 further comprising an outer insulative coating applied to the outer surfaces of the heat sink to prevent heat from radiating outwardly from the heat sink except into passages between the plurality of adjacent fins.

5. The heat sink of claim 1 further comprising a third thermal plate integral with the plurality of fins and positioned between the first thermal plate and the second thermal plate.

6. The heat sink of claim 1 wherein the plurality of adjacent fins are each substantially planar along their interfacing side surfaces.

7. The heat sink of claim 1 wherein the plurality of adjacent fins are each 0.5 to 1.5 mm thick between the interfacing side surfaces.

8. The heat sink of claim 1 wherein the plurality of adjacent fins are each spaced a distance of 1.0 to 2.5 mm to form the fluid passages between the interfacing side surfaces.

9. The heat sink of claim 1 wherein the plurality of adjacent fins are each spaced with their interfacing side surfaces in parallel.

10. The heat sink of claim 1 further comprising additional fins in heat conduction communication with the first thermal plate.

11. A heat sink comprising: a first thermal plate, a second thermal plate, a plurality of fins integral with and extending between both the first thermal plate and the second thermal plate, and an outer insulative coating applied to outer surfaces of the heat sink to prevent heat from radiating outwardly from the heat sink except into passages between the fins.

12. The heat sink of claim 11 wherein first and second thermal plates are positioned at external sides of the heat sink.

13. The heat sink of claim 11 wherein the thermal plates are positioned at opposite ends of the heat sink with the fins extending substantially perpendicularly therebetween.

14. The heat sink of claim 11 further comprising a third thermal plate integral with the plurality of fins and positioned between the first thermal plate and the second thermal plate.

15. A heat sink comprising: a first thermal plate, a second thermal plate, a plurality of fins integral with and extending between both the first thermal plate and the second thermal plate and a third thermal plate integral with the plurality of fins and positioned between the first thermal plate and the second thermal plate.

16. The heat sink of claim 15 wherein first and second thermal plates are positioned at external sides of the heat sink.

17. The heat sink of claim 15 wherein the thermal plates are positioned at opposite ends of the heat sink with the fins extending substantially perpendicularly therebetween.

18. The heat sink of claim 15 further comprising an outer insulative coating applied to outer surfaces of the heat sink to prevent heat from radiating outwardly from the heat sink except into passages between the fins.

* * * * *